Oct. 26, 1965 J. V. ROGERS 3,214,607

PULSE GENERATOR CIRCUIT

Filed Aug. 15, 1961 2 Sheets-Sheet 1

INVENTOR.
JOHN V. ROGERS
BY
BUCKHORN, CHEATHAM & BLORE
ATTORNEYS

INVENTOR.
JOHN V. ROGERS
BY
BUCKHORN, CHEATHAM & BLORE
ATTORNEYS

United States Patent Office 3,214,607

Patented Oct. 26, 1965

3,214,607

PULSE GENERATOR CIRCUIT

John V. Rogers, Portland, Oreg., assignor to Tektronix, Inc., Beaverton, Oreg., a corporation of Oregon Filed Aug. 15, 1961, Ser. No. 131,647
11 Claims. (Cl. 307—88.5)

The subject matter of the present invention relates generally to a pulse generator circuit including circuits for controlling a gating transistor to cause it to change the conduction of its collector-emitter circuit alternately between a conducting and nonconducting condition and more specifically relates to a fast ramp generator and comparator circuit which, in response to an input trigger pulse, produces a fast ramp voltage pulse increasing in amplitude linearly with time, which fast ramp pulse is initiated when such transistor is changed from one of its conducting conditions to the other and is stopped when a comparator circuit causes the gating transistor to again change its conducting condition as a result of the amplitude of the fast ramp voltage pulse exceeding the reference voltage of the comparator circuit. At the time the fast ramp voltage pulse is discontinued a narrow output trigger pulse is also produced. Each output trigger pulse is delayed in time relative to the time of initiation of the corresponding fast ramp voltage pulse by an amount depending upon the amplitude of the reference voltage.

The fast ramp generator and comparator circuit of the present invention is particularly useful in a cathode ray oscilloscope of the sampling type. Such a sampling cathode ray oscilloscope may be used to display at lower frequencies the wave forms of repetitive signals having a frequency of the order of 1000 megacycles per second. Such signals cannot be displayed by conventional oscilloscopes which usually are limited to operations with signals having a frequency of a few megacycles. The sampling oscilloscope is able to display a reproduction of a repetitive input signal wave form of very high frequency by obtaining a sample from a different portion of each of a plurality of successive input signal wave forms and combining these samples to form a composite image on the the screen of a cathode ray tube which is an accurate reproduction, at a lower frequency within the capabilities of a conventional oscilloscope, of the repetitive input signal wave forms so sampled.

In order to obtain a sample of an input signal wave form, an input trigger pulse derived from an incoming wave form to be sampled is employed to control the production of a narrow sampling pulse. Such sampling pulse is employed to derive, from a selected portion of an input signal wave form, a sample having an amplitude proportional to the amplitude of such portion. In order to provide time for the production of such sampling pulse, the wave form to be sampled may be sent through a delay line before being sampled. Also the phase or time relationship between the successive sampling pulses and the successive input signal wave forms must vary in order to sample different portions of such input signal wave forms. The fast ramp generator and comparator circuit of the invention may be used to produce output trigger pulses having such phase or time difference between successive pulses and the wave forms to be sampled, in a manner hereafter described. Such output trigger pulses can be employed to control the time of production of the sampling pulses.

Briefly, the fast ramp generator and comparator circuit of the present invention includes a source of substantially constant current which is normally connected to ground through a gating transistor and which is also connected to a fast ramp voltage pulse forming network having a capacitor charged by such constant current. The conduction of the gating transistor is controlled by a pair of tunnel diodes. The intermediate negative resistance portions of the operating characteristic of such tunnel diodes during forward conduction are utilized so that one of such tunnel diodes, when triggered by an input triggering pulse derived from an input wave form, causes the gating transistor to become nonconducting to disconnect the ramp forming network from ground and allow such constant current to flow therethrough to enable it to produce a fast ramp voltage. The fast ramp voltage thus being generated is compared with a stairstep reference voltage by a comparator transistor circuit and when the ramp voltage slightly exceeds the stairstep voltage the second tunnel diode operates to produce a narrow voltage pulse which is amplified to produce the output trigger pulse referred to above. The pulse produced by the second tunnel diode is also employed to render the gating transistor again conducting to return the fast ramp voltage to its starting voltage.

The use of two separate tunnel diodes enables the gating transistor to close and open a current gate, i.e., to be changed from its conducting to its nonconducting condition and vice versa, at extremely high speeds and also enables the production of very narrow, accurately controlled output trigger pulses. Successive output trigger pulses can be delay in time with respect to the input triggering pulse and thus with respect to the wave form to be sampled by an amount determined by the amplitude of the stairstep voltage referred to above. The output trigger pulses from the fast ramp generator and comparator circuit can also be employed in a stairstep generator to increase the amplitude of the stairstep reference voltage one voltage step for each output trigger pulse so that such output trigger pulses are progessively delayed in time with respect to the initiation of successive fast ramp voltage pulses by input trigger pulses. By employing input triggering pulses, derived from the same portions of successive input wave forms to be sample, to trigger the initiation of the fast ramp voltage pulses such output trigger pulses are progressively delayed in time with respect to the successive input signal waves forms which are sampled.

Therefore, one object of the present invention is to provide an improved electrical circuit for generating pulses.

Another object of the invention is to provide an improved electrical circuit which employs tunnel diodes to control the conduction of a transistor which in turn controls the starting and stopping of a voltage pulse.

A further object of the present invention is to provide a fast ramp voltage generator circuit which uses two separate tunnel diodes to render a gating transistor alternately nonconducting and conducting in order to control when current flows through a fast ramp voltage pulse forming network.

Still another object of the invention is to provide a pulse generator in which separate tunnel diodes are employed to start and stop the forming of a fast ramp voltage pulse and in which a comparator transistor controlled by a stairstep voltage causes operation of one of said tunnel diodes to generate a narrow pulse employed to stop such ramp voltage pulse at a time after the starting of such ramp voltage dependent upon the amplitude of the stairstep voltage and also employed to increase the amplitude of such stairstep voltage by one step.

Still another object of the invention is to provide a fast ramp voltage generator and comparator circuit for use in a cathode ray oscilloscope of the sampling type, in which a constant current source is connected either directly to ground or to a fast ramp voltage forming capacitor by a gating transistor which is alternately rendered nonconducting and conducting by two separate tunnel diodes inter-connected by a feed-back diode, and in which a comparator transistor causes actuation of one of said tunnel diodes when the ramp voltage bears a predetermined relation to a separately generated stairstep voltage to cause production of an output trigger pulse employed to produce a sampling pulse at a time which is delayed with respect to the corresponding wave form of the input signal to be sampled by an amount depending upon the amplitude of such stairstep voltage.

Additional objects and advantages of the present invention will become apparent from the following detailed description of a preferred embodiment thereof, and to the attached drawings of which:

Figure 1:
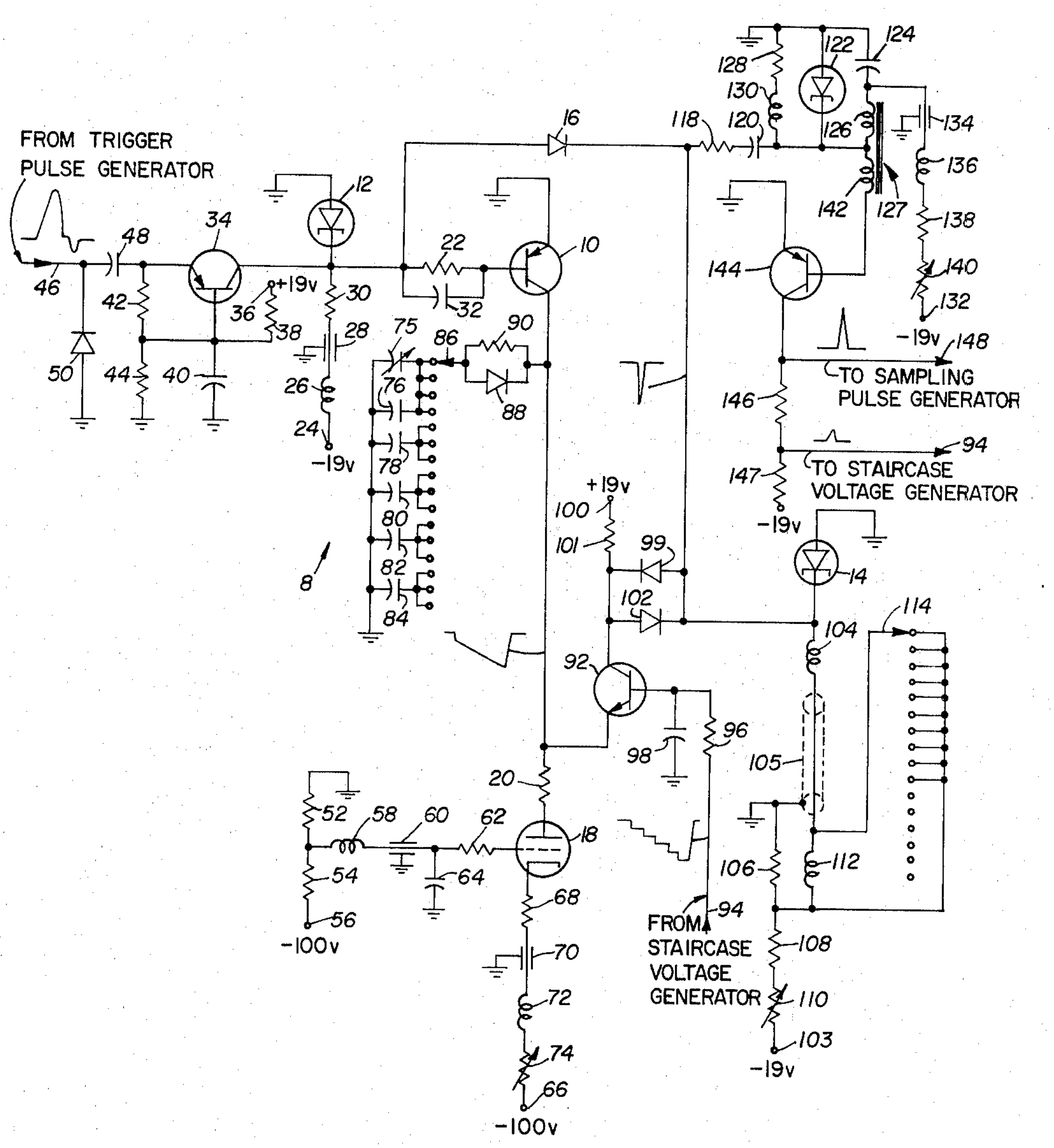
FIG. 1 is a schematic diagram of one embodiment of a fast ramp generator and comparator circuit in accordance with the present invention.

One embodiment of the fast ramp generator and comparator circuit 8 of the present invention is shown in FIG. 1 to include a gating transistor 10 of the PNP type, which has its collector-emitter circuit normally conducting. Such circuit is rendered nonconducting to start the generation of a fast ramp voltage by a positive going voltage pulse applied to its base from a first tunnel diode 12 and is again made conducting by a negative going pulse applied to its base from a second tunnel diode 14 through a feed-back diode 16 connected to transmit such pulse from the cathode of the second tunnel diode 14 to the cathode of first tunnel diode 12 and also to the base of the gating transistor 10.

A constant current vacuum tube 18 of the triode type has its anode connected to the collector of the gating transistor 10 through a plate resistor 20 to provide a source of regulated current of substantially constant amplitude regardless of the load on the anode circuit of the tube 18. The gating transistor 10 is normally forwardly biased by a small negative D.C. bias voltage on the base thereof, so that current from the constant current tube 18 normally flows through the collector-emitter circuit of such gating transistor to ground. This negative bias voltage is applied to the base of the gating transistor 10 through a biasing resistor 22 from a source 24 of negative D.C. voltage, which also serves to forwardly bias the tunnel diode 12, and also through a series circuit including an inductance 26, a feed-through capacitor 28, and a resistor 30. This series circuit is also the load circuit for the cathode of the tunnel diode 12 whose anode is grounded and acts in conjunction with other circuit elements to cause the tunnel diode 12 to operate as a bistable multivibrator. A capacitor 32 is connected to the base electrode of gating transistor 10 in parallel with the resistor 22 in order to make gating transistor 10 fast acting.

The cathode of tunnel diode 12 is connected to the collector of a PNP transistor 34 which is connected as a common base type amplifier. The base of the transistor 34 is connected to a source of positive D.C. bias voltage 36 through a resistor 38, and to ground through a by-pass capacitor 40. The emitter of transistor 34 is connected to ground through a pair of series resistors 42 and 44 which have their common terminal connected to the base of such transistor, so that the resistors 38 and 44 form a voltage divider circuit. The emitter of the transistor 34 is connected to a source of input triggering pulses, such as the triggering pulse generator 46 of FIG. 2, through a coupling capacitor 48. A by-pass diode 50 shunts any negative signals directly to ground so that only positive voltage pulses are applied through the transistor 34 to the cathode of tunnel diode 12. As indicated above, voltages and load circuit of the tunnel diode 12 are such that it operates as a bistable multivibrator resulting in the voltage of its cathode rapidly moving in a positive direction from a stable negative voltage to another stable negative voltage near ground potential when such positive pulse is applied to its cathode.

The regulated current source includes constant current tube 18, a pair of voltage divider resistors 52 and 54 connected, respectively, to ground and a source of negative D.C. bias voltage 56 with their common terminal connected to the grid of the tube 18 through a series circuit including an inductance 58, a feed-through by-pass capacitor 60, and a resistor 62. A by-pass capacitor 64 is shown as being connected between ground and the terminal of the resistor 62 remote from the grid of the tube 18, such capacitor having been found desirable in one specific construction because of a considerable length of connector between the capacitor 60 and the resistor 62. A source of negative D.C. voltage 66 is connected to the cathode of tube 18 through a resistor 68, a feed-through capacitor 70, an inductor 72, and a variable resistor 74 which may be used to adjust the current flowing through tube 18. The grid and cathode circuits just described enable the tube 18 to be fast acting so as to maintain its anode current substantially constant even though the load in its anode circuit rapidly varies.

The ramp forming network of the fast ramp generator includes a variable capacitor 75 in parallel with a fixed capacitor 76 and a plurality of other fixed capacitors 78, 80, 82, and 84 of progressively increasing capacitance, all having one of their terminals connected to ground. The other terminals of such capacitors are connected to contacts of a selector switch 86 which connects one of the fixed capacitors at a time through a parallel circuit including a diode 88 and a resistor 90 to the collector of the transistor 10 and to the constant current tube 18. The voltage at the collector of the gating transistor 10 is normally close to ground potential when the emitter collector circuit is conducting but when such circuit of the transistor 10 is rendered nonconducting by a positive going pulse applied to the base of such transistor from the tunnel diode 12, the capacitors 75 and 76 (or capacitors 78, 80, 82 or 84) connected through the switch 86 begin to charge negatively. The shunting resistance 90, connected in parallel with the coupling diode 88, provides a small D.C. voltage jump and then the fast ramp voltage is formed by the charging capacitors 75 to 84 from the constant current source including the tube 18. The greater the capacitance of the particular capacitor selected, the slower the rise of the ramp voltage and the greater the time before it reaches a given voltage.

Figure 2:
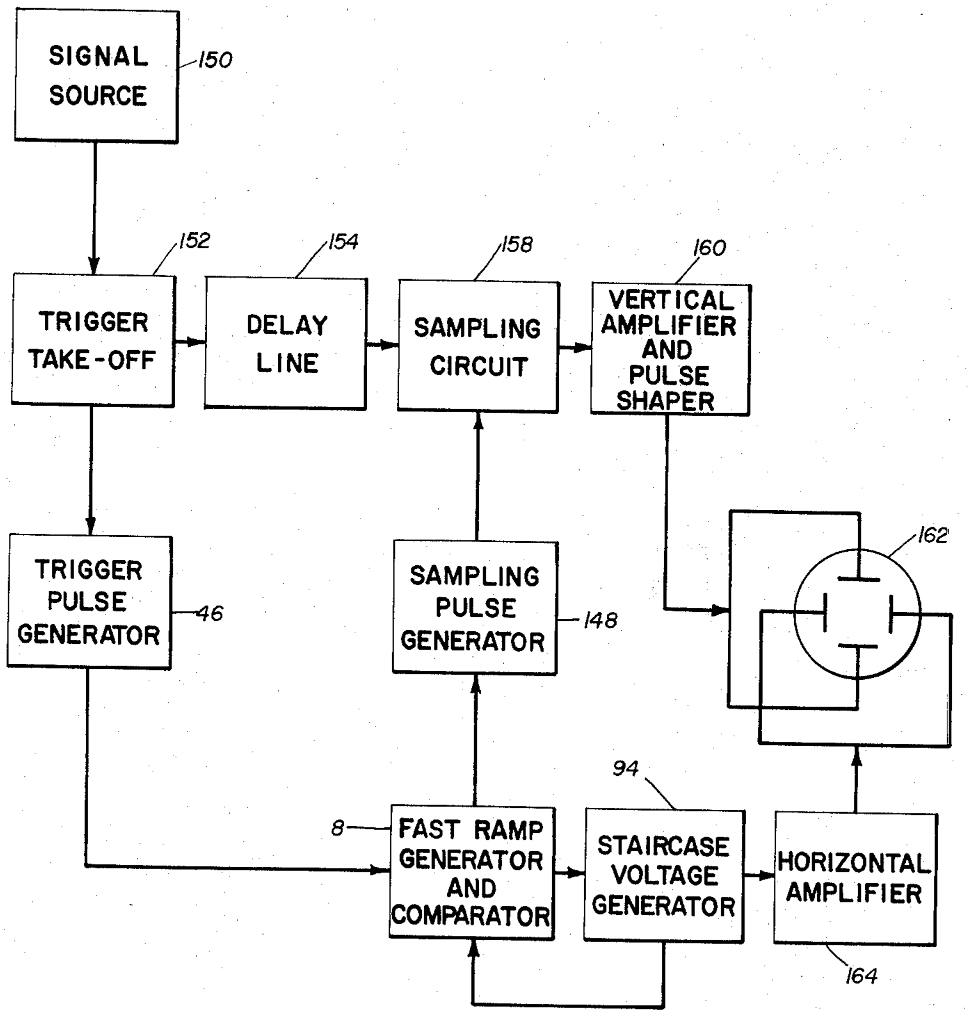
FIG. 2 is a simplified block diagram of the horizontal and vertical channels of a sampling type cathode ray oscilloscope showing the position of the fast ramp generator and comparator circuit of FIG. 1 in the general oscilloscope circuits.

The negative fast ramp voltage produced by the fast ramp generator described above is transmitted to the emitter electrode of a comparator transistor 92 of the NPN type, which has its base connected to a source of reference voltage, such as the staircase voltage generator 94 shown in FIG. 2, through a resistor 96. A by-pass capacitor 98 connected to the base of the transistor 92 shunts transients to ground. The reference voltage applied to the base of the comparator transistor 92 through resistor 96 is negative, so that the emitter-collector circuit of such transistor is normally nonconducting. It becomes conducting only when the negative fast ramp voltage applied to the emitter of such comparator transistor becomes of greater amplitude than that of the particular voltage step transmitted from the staircase voltage generator 94. The collector of the comparator transistor 92 is connected to the cathode of the second tunnel diode 14 through coupling diodes 99 and 102 and to a source 100 of positive D.C. collector voltage through a load resistor 101. The diodes 99 and 102 are connected in parallel and so that at least one of them is always conducting. The diode 102 is normally forward biased and acts as a unidirectional resistance unit which normally shunts the diode 99 for negative going pulses from the collector of the transistor 92 and which holds such collector normally positive even though the cathode of tunnel diode 14 is normally slightly negative. When the collector-emitter circuit of the comparator transistor 92 conducts, a negative going pulse is transmitted through the coupling diode 102 to the cathode of the second tunnel diode 14. The load impedance and voltage applied to the cathode of such second tunnel diode are such that the tunnel diode acts as a monostable multivibrator and a fast rising, narrow, negative pulse is produced at its cathode and transmitted through the feedback diode 16 to the cathode of the first tunnel diode 12 and to the base of the gating transistor 10. This causes the first tunnel diode 12, acting as a bistable multivibrator, to return to its normal stable position and gating transistor 10 to return to the normally conducting condition of its emitter-collector circuit which returns the ramp voltage to its initial voltage near ground potential.

The second tunnel diode 14 has its anode connected directly to ground and its cathode connected to a source of negative D.C. voltage 103 through an inductor 104 having a small value of inductance, the inner conductor of a coaxial cable connector 105, and a voltage divider circuit including fixed resistors 106 and 108 and a variable resistor 110, the resistor 106 being connected between the resistor 108 and ground. A larger compensation inductance 112 can be connected in series with resistor 108 and the inner conductor of the coaxial cable. However, this compensation inductance 112 is short circuited by a switch 114 when such switch is in the position shown, and is only actively connected in the circuit when the switch 114 is in its lower six positions. Since switch 114 is ganged with the selector switch 86 connected to the ramp forming capacitors, compensation inductance 112 is only switched into the circuit when either of the two high capacitance capacitors 82 and 84 are used to form the fast ramp voltage. The large compensation inductance 112 widens the voltage pulse from tunnel diode 14, and prevents improper triggering of such tunnel diode by the current pulse from comparator transistor 92 which tends to be widened by the slower decrease of the fast ramp voltage applied to the emitter of such transistor due to the longer length of time required to discharge the larger capacitors in the fast ramp circuit. The widening of the pulse from tunnel diode 14 by inserting the inductor 112 in its cathode circuit prevents the production of more than one amplified output trigger pulse per ramp voltage pulse, as is described below.

A small portion of the negative pulse from tunnel diode 14 is transmitted through resistor 118 and coupling capacitor 120 to the cathode of a third tunnel diode 122 which is connected as a monostable multivibrator. The circuit of such third tunnel diode includes a capacitor 124 in series with the primary winding 126 of a transformer 127 with the resulting series circuit being connected in parallel with such third tunnel diode and in parallel with another series circuit including a resistor 128 and inductor 130. The anode of tunnel diode 122 is connected to ground along with one terminal of capacitor 124 and resistor 128. A source of negative D.C. voltage 132 is connected between capacitor 124 and inductance 126 through a feed-through capacitor 134, an inductor 136, a fixed resistor 138, and a variable resistor 140. A secondary winding 142 on the transformer 127 is connected between the base of a PNP transistor 144 and the cathode of the tunnel diode 122. The transistor 144 has its emitter grounded and its collector connected through load resistors 146 and 147 to a source of negative D.C. voltage so that it functions as a common emitter amplifier. Upon the arrival of a negative pulse from the second tunnel diode 14 a negative pulse of greater amplitude is generated by the third tunnel diode 122 and is transmitted through the transformer 127 and amplifier transistor 144. The resulting output trigger pulse developed across the load resistors 146 and 147 may be employed as a trigger pulse for a sampling pulse generator, such as the sampling pulse generator 148 of FIG. 2. A portion of such output trigger pulse may be also transmitted from the common terminals of the resistors 146 and 147 to the staircase generator 94 shown in FIG. 2. The staircase generator may be of any suitable type such as a Miller integrator circuit and adds a negative voltage step to its output each time an output trigger pulse is received from the transistor 144 until a predetermined maximum negative voltage is produced at which time the stairstep voltage is returned to ground potential.

The operation of the fast ramp generator and comparator circuit of FIG. 1 may best be described by also referring to FIG. 2, which is a simplified block diagram of the vertical and horizontal channels of a cathode ray oscilloscope of the sampling type. As shown in FIG. 2, a source 150 of repetitive input signals which are to be sampled is connected to a trigger take-off circuit 152. The trigger take-off circuit extracts a small portion of the input signal energy from such signal and transmits such portion to the trigger pulse generator 46. The major portion of the signal is delivered through a delay line 154 to a sampling circuit 158. The input signal portion transmitted to the trigger pulse generator 46 produces a positive going input trigger pulse which is transmitted to the fast ramp generator and comparator circuit 8 of the present invention.

In FIG. 1, the positive input trigger pulse is transmitted through the input amplifier transistor 34 to the cathode of the first tunnel diode 12 operating as a bistable multivibrator. This input tunnel diode 12 is normally forwardly biased to a first stable condition in which it has a high resistance relative to a second stable position. The positive voltage pulse from amplifier transistor 34 reduces the negative cathode voltage of tunnel diode 12 to reduce its forward bias so that its operating point changes from its first stable position to a second stable position of reduced forward bias voltage and reduced resistance. This action of the tunnel diode 12 produces an extremely fast rising positive going voltage which is applied to the base of the normally conducting gating transistor 10 to cause the emitter-collector circuit of such gating transistor to be nonconducting.

The result of making gating transistor 10 nonconducting is to allow the current supplied by constant current tube 18 to flow through coupling diode 88 to the ramp forming capacitors 75 and 76, or other ramp forming capacitor selected by the switch 86, causing such capacitors to charge and form the fast ramp voltage pulse. This fast ramp voltage goes progressively more negative at a constant rate after an initial negative step produced by the resistor 90 and diode 88 parallel circuit. This negative ramp voltage applies a resultant forward bias to the comparator transistor 92 when the amplitude of the ramp voltage becomes greater than the negative reference voltage applied to the base of such comparator transistor from staircase generator 94. The resulting negative going voltage pulse produced by comparator transistor 92 is transmitted through coupling diode 102 to the cathode of the second tunnel diode 14, which operates as a monostable multivibrator normally forwardly biased to a low voltage, low resistance condition.

The negative comparator voltage pulse applied to the cathode of tunnel diode 14 carries it across its negative resistance region of operation so that the operating point of the tunnel diode rapidly changes to produce an increased resistance and increased negative voltage. The tunnel diode 14 thus produces a fast rising negative pulse at its cathode. This negative pulse is partially transmitted to the third tunnel diode 122 connected as a monostable multivibrator so that such diode produces a single pulse which is transmitted through the transformer 127 and amplified by the transistor 144 to provide an output triggering pulse delivered to the sampling pulse generator 148 for triggering the production of a sampling pulse and to the staircase generator 94 to cause the addition of another negative increment to the staircase voltage which in turn is applied to the base of comparator transistor 92 to cause a further delay of the next fast ramp voltage pulse.

A larger portion of the negative pulse from the tunnel diode 14 is transmitted through feed-back diode 16 to the cathode of the first tunnel diode 12 so that such tunnel diode returns to its normal operating condition in which its cathode voltage is the more negative of the two stable operating points. This also makes gating transistor 10 again conducting, so that ramp forming condensers 75 and 76 are discharged and the ramp voltage returns substantially to ground potential. The comparator transistor 92 becomes nonconducting so the second tunnel diode 14 returns to its normal operating position automatically due to its monostable operation. The fast ramp generator and comparator circuit is thereby conditioned for another ramp forming operation. The pulse from the tunnel diode 14 is normally sufficiently narrow that the tunnel diode 122 produces one pulse only for each pulse from the tunnel diode 14. However, for the slower ramp voltages produced by the larger timing capacitors 82 and 84, the compensation inductor 112 is inserted in the cathode circuit of the tunnel diode 14 to widen the pulse from such diode and to prevent it from being improperly triggered and producing two or more output pulses for one pulse from the comparator transistor 92.

Referring again to FIG. 2, the sampling pulse produced by the sampling pulse generator 148, under control of the output triggering pulse from the fast ramp generator and comparator 8, is transmitted to a sampling circuit 158 in which the sampling pulse is employed to derive a sample voltage from a selected portion of the input signal wave form transmitted through delay line 154 so that the same input signal which generated the sampling pulse is sampled by the sampling pulse so generated. The sample thus obtained is transmitted through a vertical amplifier and pulse shaper circuit 160 to the vertical deflection plates of a cathode ray tube 162 of the sampling oscilloscope.

The staircase generator 94 is connected to a horizontal amplifier 164 which in turn is connected to the horizontal deflection plates of the cathode ray tube 162, so that the same stairstep voltage which is employed to control the time of production of a given sampling pulse is applied in amplified form to the horizontal deflection plates at the same time the sample, derived by such sampling pulse from the wave form which triggered the sampling pulse, is applied to the vertical deflection plates. It should be noted that the output trigger pulses transmitted from the fast ramp generator and comparator circuit 8 to the sampling pulse generator 148 are "slewed" or progressively delayed in time with respect to the successive input signal wave forms so that the sampling pulses triggered thereby and used to sample such signal wave forms, are similarly progressively delayed. This results from the fact that in the fast ramp generator and comparator circuit 8 the negative stairstep voltage applied to comparator transistor 92 from the staircase generator increases in amplitude with each output trigger pulse so that the amplitude of the portion of fast ramp voltage pulse necessary to make such comparator transistor conduct must also be progressively greater for successive fast ramp voltage pulses. The resulting slewed output trigger pulse allows the sampling pulses from sampling pulse generator 148 to sample progressively later portions of successive input signal wave forms in the sampling circuit 158 so that each sample represented by a dot on the fluorescent screen of the cathode ray tube 162 accurately reproduces a different portion of each of the successive wave forms of the repetitive signal sampled.

As a specific example, the components used in the fast ramp generator and comparator circuit of FIG. 1 may be as follows:

| | |
|---|---|
| Resistor **20** | 100 ohms. |
| Resistor **22** | 100 kilohms. |
| Inductor **26** | 40 microhenries. |
| Capacitor **28** | 1500 picofarads. |
| Resistor **30** | 6.8 kilohms. |
| Capacitor **32** | 82 microfarads. |
| Resistor **38** | 5.6 kilohms. |
| Capacitor **40** | .001 microfarad. |
| Resistor **42** | 100 ohms. |
| Resistor **44** | 1.2 kilohms. |
| Capacitor **48** | .001 microfarad. |
| Resistor **52** | 33 kilohms. |
| Resistor **54** | 33 kilohms. |
| Inductor **58** | 40 microhenries. |
| Capacitor **60** | 1500 picofarads. |
| Resistor **62** | 27 ohms. |
| Capacitor **64** | .001 microfarad. |
| Resistor **68** | 4.7 kilohms. |
| Capacitor **70** | 1500 picofarads. |
| Inductor **72** | 40 microhenries. |
| Resistor **74** | 2.5 kilohms. |
| Capacitor **75** | 7 to 45 picofarads. |
| Capacitor **76** | 180 picofarads. |
| Capacitor **78** | .001 microfarad. |
| Capacitor **80** | .01 microfarad. |
| Capacitor **82** | 0.1 microfarad. |
| Capacitor **84** | 1.0 microfarad. |
| Resistor **90** | 100 kilohms. |
| Resistor **96** | 100 kilohms. |
| Capacitor **98** | 47 microfarads. |
| Resistor **101** | 10 kilohms. |
| Inductor **104** | 50 microhenries. |
| Resistor **106** | 4.7 kilohms. |
| Resistor **108** | 680 ohms. |
| Resistor **110** | 1 kilohm. |
| Inductor **112** | 500 microhenries. |
| Resistor **118** | 100 ohms. |
| Capacitor **120** | 27 microfarads. |
| Capacitor **124** | .001 microfarad. |
| Resistor **128** | 2.4 ohms. |
| Inductor **130** | 35 microhenries. |
| Capacitor **134** | 1500 picofarads. |
| Inductor **136** | 40 microhenries. |
| Resistor **138** | 300 ohms at 5 watts. |
| Resistor **140** | 500 ohms. |
| Resistor **146** | 560 ohms. |

It will be obvious that various changes may be made in the details of the preferred embodiment of the present invention without departing from the spirit of the invention. Therefore, it is not intended to limit the scope of the present invention to the above detailed description thereof, but that such scope should only be determined by the following claims.

I claim:

1. An electrical circuit for opening and closing a gating device to control the formation of ramp voltage pulses, comprising:

a semiconductor gating device having an emitter electrode, a collector electrode and a base electrode, a regulated source of current of substantially constant amplitude connected to said collector electrode of said gating device, a first semiconductor control device having an intermediate negative resistance portion between two positive resistance portions of its impedance characteristic during forward conduction and connected as a bistable switch to said base electrode of said gating device to establish when said gating device does and does not conduct current from said current source between said emitter electrode and said collector electrode in response to one or the other of the two stage operating states of said first control device, a pulse forming impedance including at least one capacitor connected to said collector electrode of said gating device so that a ramp-shaped voltage is formed by said pulse forming impedance when said gating device allows current to flow through said pulse forming impedance from said current source,

- a second semiconductor control device similar to said first control device connected as a monostable switch to said collector electrode of said gating device so that said second control device is changed from its stable operating state to a non-stable operating state by said ramp-shaped voltage, and
- feedback means including a diode connected between said second control device and said base electrode of said gating device to change the conductivity of said gating device from that established by said first control device, in response to a feedback signal from said second control device.

2. An electrical circuit for generating a voltage pulse by controlling the conduction of a gating transistor, comprising:
- a gating transistor having emitter, collector and base electrodes,
- a regulated source of current having a substantially constant amplitude connected to said collector electrode of said gating transistor,
- a first tunnel diode connected to said base electrode of said gating transistor to control when said gating transistor conducts current from said current source,
- a pulse forming network connected to said collector electrode of said gating transistor so that a voltage pulse is formed by said network when said gating transistor allows current to flow through said network from said current source,
- a second tunnel diode connected to be controlled by the voltage on said collector electrode of said gating transistor, and
- a feedback diode connected between said second tunnel diode and said base electrode of said gating transistor to change the conductivity of said transistor from that established by said first tunnel diode in response to said second tunnel diode.

3. An electrical circuit for generating a ramp-shaped voltage pulse by controlling the conduction of a gating transistor, comprising:
- a gating transistor having emitter, collector and base electrodes,
- a regulated source of current having a substantially constant amplitude regardless of the load impedance connected to said collector electrode of said gating transistor,
- a first tunnel diode connected to said base electrode of said gating transistor to control when said transistor conducts current from said current source,
- a pulse forming impedance including at least one capacitor connected to said collector electrode of said gating transistor so that a ramp-shaped voltage pulse is formed when said gating transistor allows current to flow through said impedance from said current source,
- a second tunnel diode connected to be controlled by the voltage on said collector electrode of said gating transistor, and
- a feedback diode connected between said second tunnel diode and said base electrode of said gating transistor to change the conductivity of said transistor from that established by said first tunnel diode in response to said second tunnel diode so that one of said tunnel diodes opens and the other closes said gating transistor.

4. An electrical circuit for generating progressively delayed voltage pulses by conduction of a gating transistor, comprising:
- a gating transistor having emitter, collector and base electrodes,
- a regulated source of current having a substantially constant amplitude connected to said collector electrode of said gating transistor,
- a first tunnel diode connected as a bistable switch to said base electrode of said gating transistor to control when said transistor conducts current by changing to one of its stable operating states in response to an input pulse,

- a pulse forming network including a capacitor connected to said collector electrode of said gating transistor so that a ramp-shaped voltage pulse is formed when said gating transistor allows current to flow through said network from said current source,
- means for generating a staircase-shaped voltage which increases in amplitude by successive discrete voltage steps,
- a comparator transistor having its emitter electrode connected to said pulse forming network and its base electrode connected to said staircase voltage generator so that said comparator transistor will only conduct and produce a resultant pulse after the amplitude of said ramp voltage exceeds that of the step of said staircase voltage applied to its base electrode,
- a second tunnel diode connected as a monostable switch to the collector electrode of said comparator transistor so that said second tunnel diode is changed from its stable to its non-stable operating state by said resultant pulse and produces an output pulse which is progressively delayed in time compared to said ramp voltage by said successive steps of said staircase voltage, and
- a feedback diode connected between said second tunnel diode and said base electrode of said gating transistor to change the conductivity of said gating transistor from that established by said first tunnel diode in response to said output pulse from said second tunnel diode and to return said first tunnel diode to its other stable operating state from said one stable operating state.

5. A fast ramp generator and comparator circuit for use in a sampling type cathode ray oscilloscope comprising:
- a source of regulated electrical current having a substantially constant amplitude,
- a pulse forming network connected to said constant current source for generating a fast ramp voltage pulse,
- a gating transistor having its collector electrode connected to said constant current source and its emitter electrode connected to ground,
- a first tunnel diode connected to the base electrode of said gating transistor to control the conductivity of said gating transistor in response to an input trigger pulse produced by a signal wave form to be sampled and to determine when current from said current source flows through said pulse forming network to generate said fast ramp voltage pulse,
- means for generating a staircase voltage having a plurality of successive steps of progressively increasing amplitude for combination with said fast ramp voltage pulse,
- a comparator transistor having its emitter electrode connected to said pulse forming network and its base electrode connected to said staircase voltage generator means so that said comparator transistor conducts only when said fast ramp voltage exceeds the amplitude of the step of said staircase voltage applied thereto and produces a resultant voltage pulse,
- a second tunnel diode connceted to said comparator transistor so that said resultant voltage pulse produces an output trigger pulse in said second tunnel diode for each ramp voltage pulse, which is progressively delayed with respect to said signal wave form by said successive steps of staircase voltage, and
- a feedback diode connected between said second tunnel diode and said base electrode of said gating transistor to apply a portion of said output trigger pulse to said base electrode in order to change the conductivity of said gating transistor from that established by said first tunnel diode so that current ceases to flow in said pulse forming network and both of said tunnel diodes return to their normal operating conditions.

6. A fast ramp generator and comparator circuit for use in a sampling type cathode ray oscilloscope comprising:

a source of regulated electrical current having a substantially constant amplitude, a pulse forming network connected to said constant current source including at least one capacitor for shaping the wave form of a fast ramp voltage pulse, a gating transistor having its collector electrode connected to said constant current source and its emitter electrode connected to ground, a first tunnel diode connected as a bistable switch to the base electrode of said gating transistor to control the conductivity of said gating transistor in response to an input trigger pulse produced by the signal wave form to be sampled and to determine when current from said current source flows through said pulse forming network to generate said fast ramp voltage pulse, means for generating a staircase voltage having a plurality of successive steps of progressively increasing amplitude for combination with said fast ramp voltage pulse, a comparator transistor having its emitter electrode connected to said pulse forming network and its base electrode connected to said means for generating said staircase voltage in order to effectively subtract said staircase voltage from said fast ramp voltage pulse so that said comparator transistor conducts only when said fast ramp voltage exceeds the amplitude of the step of said staircase voltage applied thereto and produces a resultant voltage pulse, a second tunnel diode connected as a monostable switch to said comparator transistor so that said resultant voltage pulse produces an output trigger pulse in said second tunnel diode for each of said fast ramp voltage pulses, a feedback diode connected between said second tunnel diode and said base electrode of said gating transistor to apply a portion of said output trigger pulse to said base electrode in order to change the conductivity of said gating transistor from the established by said first tunnel diode so that said current ceases to flow in said pulse forming network, and means to apply said steps of said staircase voltage to said base electrode of said comparator transistor in a synchronized manner so that each successive step of said staircase voltage is compared with each successive fast ramp pulse in order that said trigger pulses are progressively delayed with respect to said signal wave form for sampling different portions of successive signal waveforms.

7. An electrical circuit for generating progressively delayed voltage pulses by conduction of a gating transistor, comprising:

a gating transistor having emitter, collector and base electrodes;

a regulated source of current having a substantially constant amplitude connected to said collector electrode of said gating transistor;

a first tunnel diode connected as a bistable switch to said base electrode of said gating transistor to control when said transistor conducts current by changing to one of its stable operating states in response to an input pulse;

a pulse forming network including a plurality of different value capacitors selectively connected to said collector electrode of said gating transistor so that a ramp-shaped voltage pulse is formed when said gating transistor allows current to flow through said network from said current source;

means for generating a staircase-shaped voltage which increases in amplitude by successive discrete voltage steps;

a comparator transistor having its emitter electrode connected to said pulse forming network and its base electrode connected to said staircase voltage generator so that said comparator transistor will only conduct and produce a resultant pulse after the amplitude of said ramp voltage exceeds that of the step of said staircase voltage applied to its base electrode;

a second tunnel diode connected as a monostable switch to the collector electrode of said comparator transistor so that said second tunnel diode is changed from its stable to its nonstable operating state by said resultant pulse and produces an output pulse which is progressively delayed in time compared to said ramp voltage by said successive steps of said staircase voltage;

a feedback diode connected between said second tunnel diode and said base electrode of said gating transistor to change the conductivity of said gating transistor from that established by said first tunnel diode in response to said output pulse from said second tunnel diode and to return said first tunnel diode to its other stable operating state from said one stable operating state; and a compensation inductance selectively connected to said second tunnel diode when the larger capacitors of said pulse forming network are connected to said gating transistor, in order to widen the output pulse produced by said second tunnel diode to compensate for the increased discharge time of said larger capacitors and to prevent improper triggering of said second tunnel diode.

8. An electrical circuit for producing an output pulse at a predetermined time with respect to the application of an input trigger pulse comprising:

gating means connected to transmit or block electrical current depending upon its conductive conditions;

first control means connected as a bistable oscillator to the gating means so that the gating means changes its current conductive condition between conducting and nonconducting when an input trigger pulse switches the first control means from one to the other of its two stable states;

second control means connected as an oscillator having at least one stable state to the output of the gating means;

pulse-forming means connected to the gating means and to the second control means so that the current which flows through said gating means is caused to flow through said pulse-forming means to form a voltage pulse when the conductive condition of the gating means is changed and the voltage pulse triggers the second control means to change its operating state and cause such second control means to produce an output pulse when such voltage pulse reaches a predetermined voltage; and a feedback means connected from the second control means to the first control means to transmit a portion of the output pulse produced by the second control means as a feedback signal to switch the first control means back to its one stable state and to cause the gating means to return to its original conductive condition.

9. An electrical circuit for producting an output pulse at a predetermined time with respect to the application of an input trigger pulse comprising:

a gating device connected to transmit or block electrical current depending upon its conductive conditions;

a regulated source of current having a substantially constant value connected to the gating device so that current flows through the gating device when it is conducting;

a first control device connected as a bistable oscillator to the input of the gating device so that the gating device changes its current conductive condition between conducting and nonconducting when an input trigger pulse switches the first control device from one to the other of its two stable states;

a second control device connected as an oscillator having at least one stable state to the output of the gating device;

a pulse-forming network connected to the gating device and to the second control device so that the current which flows through said gating device is caused to flow through said network to form a voltage pulse when the conductive condition of the gating device is changed and the voltage pulse triggers the second control device to change its operating state and cause such second control device to produce an output pulse when such voltage pulse reaches a predetermined voltage, said pulse-forming network including at least one capacitor to provide the voltage pulse with a ramp shape; and means to switch the first control device back to its one stable state and to cause the gating device to return to its original conductive condition.

10. An electrical circuit for producing an output pulse at a predetermined time with respect to the application of an input trigger pulse comprising:

a gating device connected to transmit or block electrical current depending upon its conductive conditions;

a regulated source of current of substantially constant value connected to the gating device so that current flows through the gating device when it is conducting;

a first control device connected as a bistable oscillator to the input of the gating device so that the gating device changes its current conductive condition between conducting and nonconducting when an input trigger pulse switches the first control device from one to the other of its two stable states;

a second control device connected as a monostable oscillator having at least one stable state to the output of the gating device;

a pulse-forming network connected to the gating device and to the second control device so that the current which flows through said gating device is caused to flow through said network to form a voltage pulse when the conductive condition of the gating device is changed and the voltage pulse triggers the second control device to change its operating state and cause such second control device to produce an output pulse when such voltage pulse reaches a predetermined voltage, said pulse-forming network including at least one capacitor so that the voltage pulse has a ramp shape;

a feedback means connected from the second control device to the first control device to transmit a portion of the output pulse produced by the second control device as a feedback signal to switch the first control device back to its one stable state and to cause the gating device to return to its original conductive condition;

a comparator device connected to the pulse-forming network and the second control device to compare said ramp voltage with a staircase voltage reference signal applied to said comparator device in order to trigger the second control device when said ramp voltage exceeds said reference voltage and to cause the output pulse to be generated at a time related to the application of the input trigger pulse which varies in accordance with the stairstep voltage of the reference signal; and means responsive to the production of an output pulse for changing the voltage of said staircase reference signal by a predetermined amount for each successive output pulse in order to vary the time between the application of the input trigger pulse and the production of said output pulse.

11. An electrical circuit for producing an output pulse at a predetermined time with respect to the application of an input trigger pulse comprising:

a gating device connected to transmit or block electrical current depending upon its conductive conditions;

a source of current connected to the gating device so that current flows through the gating device when it is conducting;

a first control device connected as a bistable oscillator to the input of the gating device so that the gating device changes its current conductive condition between conducting and nonconducting when an input trigger pulse switches the first control device from one to the other of its two stable states;

a second control device connected as a monostable oscillator to the output of the gating device;

a pulse-forming network connected to the gating device and to the second control device so that the current which flows through said gating device is caused to flow through said network to form a voltage pulse when the conductive condition of the gating device is changed and the voltage pulse triggers the second control device to change its operating state and cause such second control device to produce an output pulse when such voltage pulse reaches a predetermined voltage, said pulse-forming network including at least one capacitor to provide the voltage pulse with a ramp shape;

a feedback means connected from the second control device to the first control device to transmit a portion of the output pulse produced by the second control device as a feedback signal to switch the first control device back to its one stable state and to cause the gating device to return to its original conductive condition;

a comparator device having an emitting electrode, a collecting electrode and a control electrode connected between the pulse-forming network and the second control device to compare said ramp voltage pulse applied to one of its electrodes with a staircase voltage reference signal applied to another of its electrodes to produce a difference signal on the third of its electrodes which triggers the second control device when said ramp voltage exceeds said reference voltage and to cause the output pulse to be generated at a time related to the application of the input trigger pulse which varies in accordance with the stairstep voltage of the reference signal;

means responsive to the production of an output pulse for changing the voltage of said staircase reference signal by a predetermined amount for each successive output pulse in order to vary the time between the application of the input trigger pulse and the production of said output pulse; and switch means for selecting the capacitor of the pulse-forming network from a plurality different capacitance capacitor, and for changing the effective load inductance of the second control device to compensate for the effect of the change of capacitance on the switching of said second control device.

References Cited by the Examiner

UNITED STATES PATENTS

| | | | |
|---|---|---|---|
| 2,522,957 | 9/50 | Miller | 328—183 |
| 2,824,962 | 2/58 | Wise | 328—183 X |
| 3,031,621 | 4/62 | Schneiner | 328—30 |
| 3,093,750 | 6/63 | Brauer | 307—88.5 |
| 3,124,706 | 3/64 | Alexander | 307—88.5 |
| 3,133,206 | 5/64 | Bergman et al. | 307—88.5 |

JOHN W. HUCKERT, *Primary Examiner.*

UNITED STATES PATENT OFFICE
CERTIFICATE OF CORRECTION

Patent No. 3,214,607 October 26, 1965

John V. Rogers

It is hereby certified that error appears in the above numbered patent requiring correction and that the said Letters Patent should read as corrected below.

Column 8, line 68, for "stage" read -- stable --; column 11, line 45, for "the" read -- that --; column 14, line 71, for "Schneiner" read -- Schreiner --.

Signed and sealed this 12th day of July 1966.

(SEAL)
Attest:

ERNEST W. SWIDER
Attesting Officer

EDWARD J. BRENNER
Commissioner of Patents